(12) United States Patent
Nishikawa et al.

(10) Patent No.: US 11,231,874 B2
(45) Date of Patent: Jan. 25, 2022

(54) MEMORY SYSTEM AND STORAGE SYSTEM

(71) Applicant: Toshiba Memory Corporation, Tokyo (JP)

(72) Inventors: Suguru Nishikawa, Osaka Osaka (JP); Masanobu Shirakawa, Chigasaki Kanagawa (JP); Yoshihisa Kojima, Kawasaki Kanagawa (JP); Takehiko Amaki, Yokohama Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 179 days.

(21) Appl. No.: 16/280,994

(22) Filed: Feb. 20, 2019

(65) Prior Publication Data

US 2020/0073592 A1 Mar. 5, 2020

(30) Foreign Application Priority Data

Aug. 28, 2018 (JP) .............................. JP2018-159252

(51) Int. Cl.
*G06F 12/00* (2006.01)
*G06F 3/06* (2006.01)
*G06F 11/30* (2006.01)
*G06F 1/20* (2006.01)
*G11C 16/30* (2006.01)

(52) U.S. Cl.
CPC .............. *G06F 3/0659* (2013.01); *G06F 1/20* (2013.01); *G06F 3/0614* (2013.01); *G06F 3/0658* (2013.01); *G06F 3/0683* (2013.01); *G06F 11/3058* (2013.01); *G11C 16/30* (2013.01)

(58) Field of Classification Search
CPC .. G06F 3/0659; G06F 3/0658; G06F 11/3058; G06F 1/20; G06F 3/0614; G06F 3/0683; G06F 3/06; G06F 11/30; G11C 16/30; G11C 16/26; G11C 7/04; G11C 16/0483
See application file for complete search history.

(56) References Cited

U.S. PATENT DOCUMENTS

| | | | | |
|---|---|---|---|---|
| 9,589,638 | B2 * | 3/2017 | Arigane | H01L 29/792 |
| 9,668,337 | B2 * | 5/2017 | Stoev | G11C 16/349 |
| 2006/0280015 | A1 * | 12/2006 | Okuyama | G11C 11/40603 365/222 |
| 2007/0091703 | A1 * | 4/2007 | Nishimura | G11C 11/406 365/212 |
| 2009/0245003 | A1 * | 10/2009 | Ito | G11C 7/04 365/211 |

(Continued)

FOREIGN PATENT DOCUMENTS

JP 2012194897 A 10/2012

*Primary Examiner* — Shawn X Gu
(74) *Attorney, Agent, or Firm* — Kim & Stewart LLP

(57) ABSTRACT

A memory system includes a nonvolatile memory including a plurality of blocks, in each of which a plurality of memory cells is arranged between bit lines and a source line, and a memory controller configured to control an operation of the nonvolatile memory. The memory controller is configured to issue a warming command to the nonvolatile memory when a temperature of the nonvolatile memory is lower than a first temperature, and the nonvolatile memory, in response to the warming command, causes current to flow through at least one bit line connected to memory cells of a first block.

12 Claims, 13 Drawing Sheets

(56) References Cited

U.S. PATENT DOCUMENTS

| | | | |
|---|---|---|---|
| 2010/0025811 A1* | 2/2010 | Bronner | H01L 27/105 |
| | | | 257/528 |
| 2010/0061137 A1* | 3/2010 | Kim | G11C 7/18 |
| | | | 365/102 |
| 2010/0329026 A1* | 12/2010 | Nakamura | G11C 16/3454 |
| | | | 365/185.21 |
| 2012/0230103 A1* | 9/2012 | Choe | G11C 16/0483 |
| | | | 365/185.2 |
| 2016/0239235 A1* | 8/2016 | Chung | G11C 16/0483 |

* cited by examiner

MEMORY SYSTEM AND STORAGE SYSTEM

CROSS-REFERENCE TO RELATED APPLICATIONS

This application is based upon and claims the benefit of priority from Japanese Patent Application No. 2018-159252, filed Aug. 28, 2018, the entire contents of which are incorporated herein by reference.

FIELD

Embodiments described herein relate generally to a memory system and a storage system.

BACKGROUND

In recent years, the capacity of a NAND type flash memory, which is a form of nonvolatile memory, has increased and a solid state drive (SSD) equipped with the NAND type flash memory has become a widely used memory system.

In the related art, the nonvolatile memory such as the NAND type flash memory has a characteristic that the reliability of the device depends on the temperature under which the device is used. For example, in a case where the nonvolatile memory is in a low temperature state and in a case where the nonvolatile memory is in a room temperature state, a threshold voltage distribution of a memory cell of the nonvolatile memory might be significantly different. As a result, when the temperatures at the time of writing and at the time of reading are different, data may not be readable because of a temperature cross.

DETAILED DESCRIPTION

Embodiments provide a memory system and a storage system capable of preventing deterioration of read accuracy due to a temperature cross.

In general, according to one embodiment, a memory system includes a nonvolatile memory including a plurality of blocks, in each of which a plurality of memory cells are arranged between bit lines and a source line, and a memory controller configured to control an operation of the nonvolatile memory. The memory controller is configured to issue a warming command to the nonvolatile memory when a temperature of the nonvolatile memory is lower than a first temperature, and the nonvolatile memory, in response to the warming command, causes current to flow through at least one bit line connected to memory cells of a first block.

Hereinafter, embodiments of the present disclosure will be described in detail with reference to the drawings. In addition, the present disclosure is not limited by the following embodiments. Further, the following embodiments include additional components which are readily apparent to those skilled in the art or other components which are substantially the same as the ones depicted.

First Embodiment

A memory system 1 according to a first embodiment will be described with reference to FIGS. 1 to 9.

(Configuration Example of Memory System)

Figure 1:
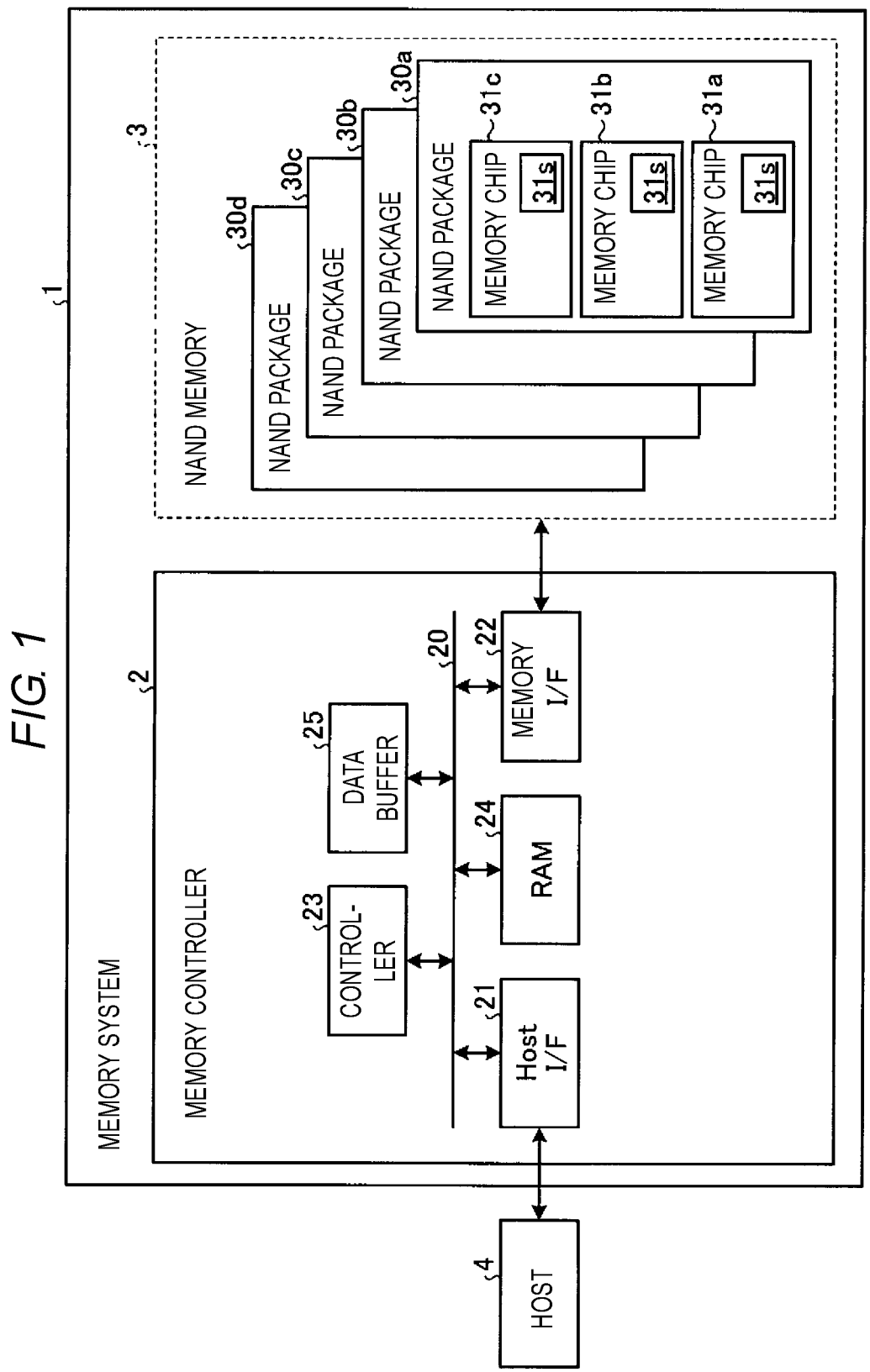
FIG. 1 is a block diagram illustrating a schematic configuration example of a memory system according to a first embodiment.

FIG. 1 is a block diagram illustrating a schematic configuration example of a memory system 1 according to a first embodiment. As illustrated in FIG. 1, the memory system 1 includes a memory controller 2 and a NAND type flash memory 3 (hereinafter, also simply referred to as a NAND memory 3) as a nonvolatile memory.

The memory system 1 may be a memory card in which the memory controller 2 and the NAND memory 3 are configured as one package, or a solid state drive (SSD). The memory system 1 is connectable to a host 4. The host 4 may be, for example, an information processing device such as a personal computer, a server, a storage box, a mobile phone, an imaging device, a portable terminal such as a tablet computer or a smart phone, a game device, or an in-vehicle terminal such as a car navigation system.

The NAND memory 3 is a nonvolatile memory which stores data in a nonvolatile manner. In the following description, a case where the NAND memory 3 having a two-dimensional planar structure is used as the nonvolatile memory, will be described, but an example of the nonvolatile memory is not limited thereto. The nonvolatile memory may be, for example, a NOR type flash memory, or a 3D structure flash memory.

The NAND memory 3 includes one or more NAND packages 30a to 30d. Four NAND packages 30a to 30d are illustrated in FIG. 1, but the number of NAND packages 30a to 30d is not limited to four, and may be one or more. When individual NAND packages 30a to 30d are not distinguished from each other, the NAND packages 30a to 30d are simply referred to as a NAND package 30.

Each NAND package 30 includes one or more memory chips 31a to 31c. Three memory chips 31a to 31c are illustrated in FIG. 1, but the number of memory included in each NAND package 30 is not limited to three but may be one or more. When individual memory chips 31a to 31c are not distinguished from each other, the memory chips 31a to 31c are simply referred to as a memory chip 31.

Each memory chip 31 includes a temperature sensor 31s that measures a temperature of the memory chip 31. The temperature sensor 31s transmits the measured temperature of the memory chip 31 to the memory controller 2 as temperature information, for example, in response to a command from the memory controller 2.

The memory controller 2 is a semiconductor integrated circuit configured, for example, as a system-on-a-chip (SoC). Some or all of various functions of the memory controller 2 may be achieved by a CPU that executes firmware, or by a hardware circuit. The memory controller 2 controls writing to the NAND memory 3 according to a write command from the host 4. Further, the memory controller 2 controls reading from the NAND memory 3 according to a read command from the host 4.

The memory controller 2 includes a host interface (host I/F) 21, a memory interface (memory I/F) 22, a controller 23, a random access memory (RAM) 24, and a data buffer 25. The host I/F 21, the memory I/F 22, the controller 23, and the data buffer 25 are connected to each other via an internal bus 20.

The host I/F 21 performs a processing according to an interface standard, and outputs an access command received from the host 4, user data to be written, and the like to the internal bus 20. Further, the host I/F 21 transmits user data read from the NAND memory 3, a response from the controller 23, and the like to the host 4.

The memory I/F 22 performs a write process to the NAND memory 3 on the basis of an instruction from the controller 23. Further, the memory I/F 22 performs a read process from the NAND memory 3 on the basis of the instruction from the controller 23.

The data buffer 25 temporarily stores data received from the host 4 by the memory controller 2 until the received data is written into the NAND memory 3. Further, the data buffer 25 temporarily stores data read from the NAND memory 3 until the data is transmitted to the host 4. As the data buffer 25, for example, a general-purpose memory such as a static random access memory (SRAM) or a dynamic random access memory (DRAM) may be used.

The controller 23 is, for example, a central processing unit (CPU). The controller 23 operates according to a firmware program. For example, the firmware program is stored in the NAND memory 3 at the time of manufacturing or shipping of the memory system 1. Upon power-up, the controller 23 loads the firmware program from the NAND memory 3 to a RAM 24. The controller 23 executes the firmware program loaded to the RAM 24 to implement various functions.

(Functional Configuration Example of Controller)

Figure 2:
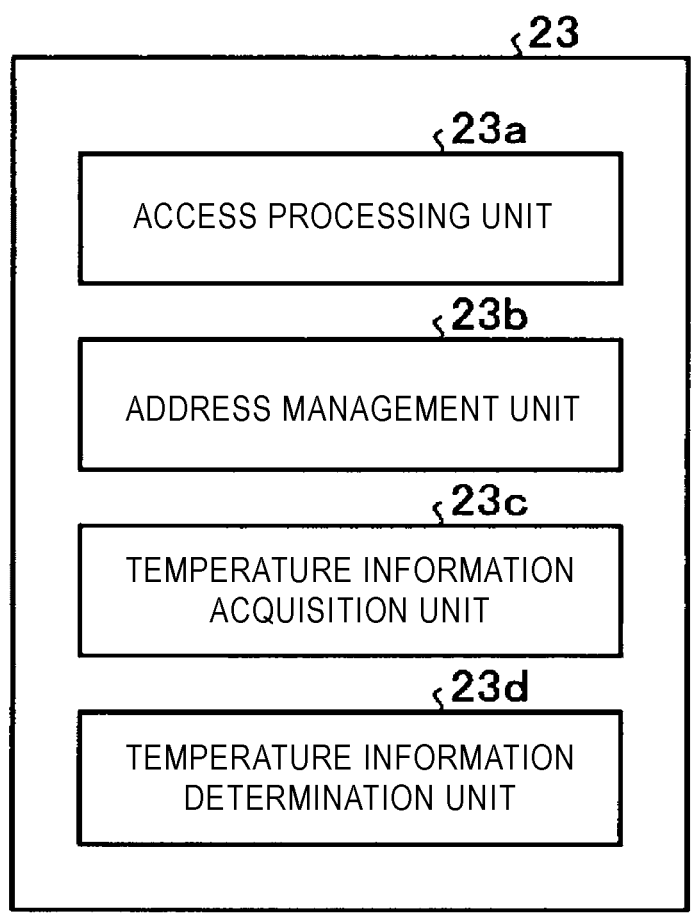
FIG. 2 is a diagram illustrating functional blocks of a controller of a memory controller according to the first embodiment.

FIG. 2 is a diagram illustrating functional blocks of the controller 23 of the memory controller 2 according to the first embodiment. As illustrated in FIG. 2, the controller includes an access processing unit 23a, an address management unit 23b, a temperature information acquisition unit 23c, and a temperature information determination unit 23d, for example, as functions implemented by the CPU. With such functioning units, the controller 23 controls each component of the memory system 1.

When the access processing unit 23a receives an access command from the host 4 via the host I/F 21, the access processing unit 23a performs a control according to the access command. The access command from the host 4 is, for example, a write command, a read command, or an erase command. For example, the access processing unit 23a instructs the memory I/F 22 to write to the NAND memory 3 according to the access command from the host 4. Further, the access processing unit 23a instructs the memory I/F 22 to read from the NAND memory 3 according to the access command from the host 4.

When receiving a write command from the host 4, the address management unit 23b determines a storage area in the NAND memory 3 for data stored in the data buffer 25. A correspondence between a logical address of the data received from the host 4 and a physical address indicating the storage area in the NAND memory 3 in which the data is to be stored, is stored as an address conversion table. The address management unit 23b manages a write destination of the data using the address conversion table.

When receiving a read command from the host 4, the address management unit 23b converts a logical address designated by the read command into a physical address using the address conversion table, and instructs the memory I/F 22 to read from the physical address.

In the NAND memory 3, in general, writing and reading are performed on the basis of a data unit called a page, and erasing is performed on the basis of a data unit called a block. In the embodiment, plural memory cells connected to the same word line are referred to as a memory cell group. When the memory cell is a single level cell (SLC) that stores 1 bit, one memory cell group corresponds to 1 page. When the memory cell is a multiple level cell (MLC) that stores multiple values (data of 2 bits or more), one memory cell group corresponds to plural pages. Note that the MLC in this description includes a triple level cell (TLC) or a quad level cell (QLC). Further, each memory cell is connected to a word line and a bit line. Accordingly, each memory cell may be specified with an address that identifies the word line and an address that identifies the bit line.

The temperature information acquisition unit 23c acquires the temperature information indicating the temperatures in the memory chips 31a to 31c from the NAND memory 3 via the memory I/F 22. Further, in the embodiment, an acquisition method of the temperature is not limited to a method of acquiring the temperature from the NAND memory 3 and may be acquired from a temperature sensor installed in the memory controller 2. As described above, the temperature sensor may be installed at any location in the memory system 1.

The temperature information determination unit 23d determines whether or not the temperature indicated by the acquired temperature information is equal to or higher than a predetermined temperature. The predetermined temperature is set according to a specification of the NAND memory 3.

The controller 23 performs a control to increase the temperature on the NAND memory 3 according to the determination result. That is, when it is determined that the temperature indicated by the acquired temperature information is lower than the predetermined temperature, the access processing unit 23a issues the warming command to a predetermined memory chip 31 in the NAND memory 3 to increase the temperature. The memory chip 31 that is the target of the warming command performs a warming operation. Details of the warming operation will be described below.

(Configuration Example of Memory Chip)

Figure 3:
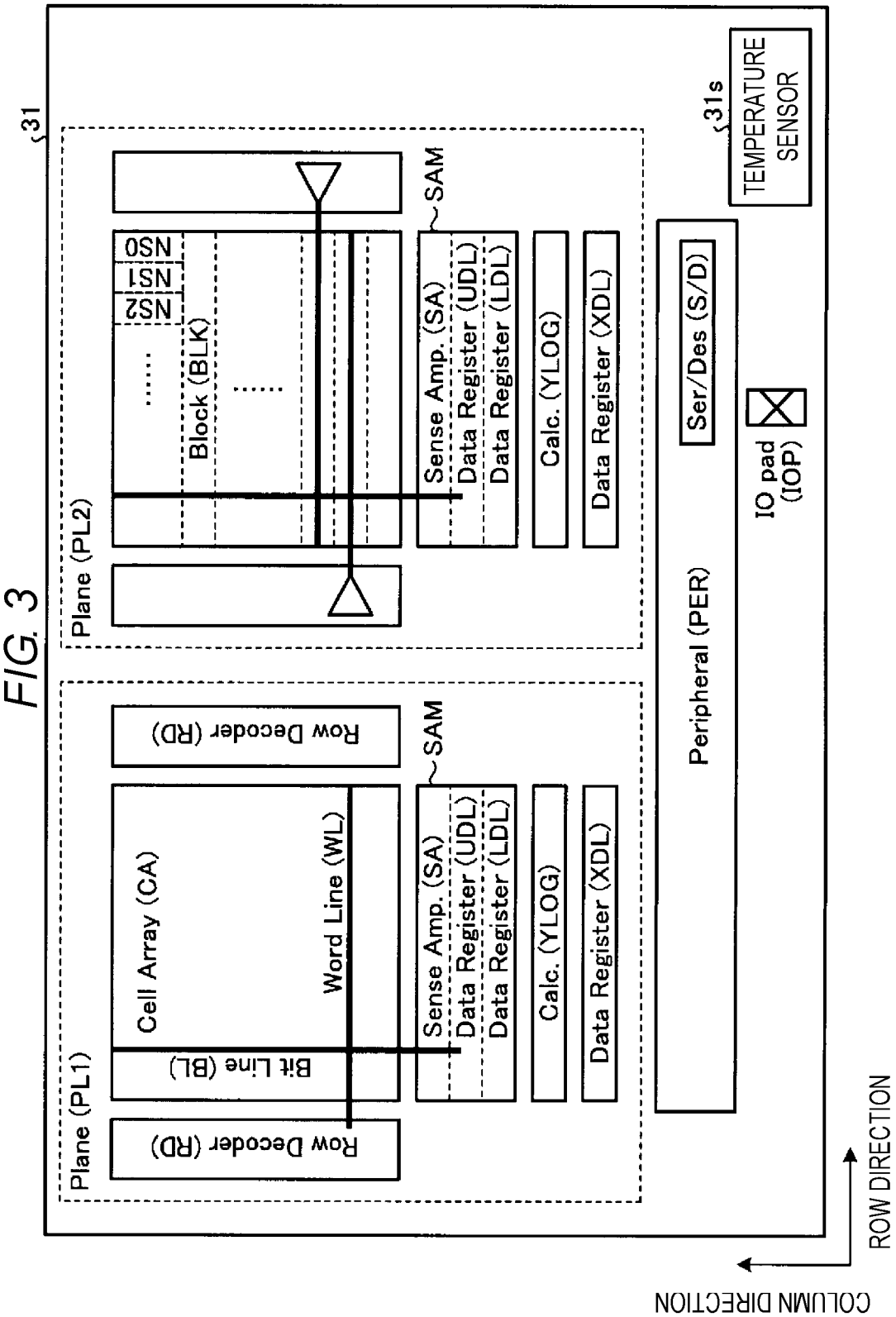
FIG. 3 is a block diagram illustrating a configuration example of a memory chip in a NAND memory according to the first embodiment.

FIG. 3 is a block diagram illustrating a configuration example of the memory chip 31 in the NAND memory 3 according to the first embodiment. The respective memory chips 31a to 31c according to the first embodiment all have the same configuration.

As illustrated in FIG. 3, the memory chip 31 includes, for example, planes PL1 and PL2, a peripheral circuit PER, and an input/output pad IOP. The number of planes in the memory chip 31 is not limited to two, and may be three or more. When individual planes PL1 and PL2 are not distinguished from each other, the planes PL1 and PL2 are simply referred to as a plane PL. Each plane PL includes a cell array CA, a row decoder RD, a sense amplifier module SAM, an arithmetic logical circuit YLOG, and a data register XDL.

The cell array CA includes plural physical blocks BLK which are a group of nonvolatile memory cells. The block BLK is an erase unit of data, and data in the same block BLK is collectively erased. Each block BLK includes a NAND string NS (NS0, NS1, NS2, etc.) in which the memory cells are connected in series.

Each memory cell is located at a point where plural bit lines BL and plural word lines WL cross each other. Each memory cell is connected to one of the plurality of bit lines BL that extend in a column direction at a predetermined pitch in a row direction. Further, each memory cell is connected to one of the plurality of word lines WL that extend in the row direction at a predetermined pitch in the column direction.

The row decoder RD decodes a block address indicated by the address management unit 23b of the controller 23 and selects a corresponding block BLK.

The sense amplifier module SAM has plural sets of a sense amplifier SA and data registers UDL and LDL. The sense amplifier SA and the data registers UDL and LDL are connected to each other through a bus (not illustrated). The sense amplifier SA is installed for each bit line BL, senses and amplifies the data read to the corresponding bit line BL, and transmits write data to the corresponding bit line BL. The data registers UDL and LDL temporarily hold data.

The arithmetic logical circuit YLOG performs arithmetic logical operations on data held in the data registers UDL and LDL.

The data register XDL is installed for each bit line BL and temporarily holds data related to the corresponding bit line BL. The data register XDL is used for a cache operation of the NAND memory 3. That is, even when the data registers UDL and LDL in the sense amplifier module SAM are in use, when the data register XDL is empty, the NAND memory 3 can receive data from the outside.

The input/output pad IOP is used in transmission and reception of various commands or data to and from the memory controller 2.

The peripheral circuit PER includes, for example, a serializer/deserializer S/D, a sequencer (not illustrated), a charge pump (not illustrated), a register (not illustrated), and a driver (not illustrated). The serializer/deserializer S/D converts data or the like sent in a form of serial signals from the outside such as the memory controller 2 or the like, to parallel signals. Further, the serializer/deserializer S/D converts data or the like that are processed in the memory chip 31 as parallel signals into serial signals. In addition, the serializer/deserializer S/D selects the column direction of the cell array CA (i.e., bit line BL).

In accordance with the sequencer that receives a command from the memory controller 2, the driver supplies voltage required for writing, reading, and erasing data to the row decoder RD, the sense amplifier SA, and a source line driver (not illustrated). The charge pump boosts power supply voltage supplied externally and supplies required voltage to the driver. The register holds various signals. The sequencer controls the operation of the entire NAND memory 3.

(Configuration Example of Block)

Figure 4:
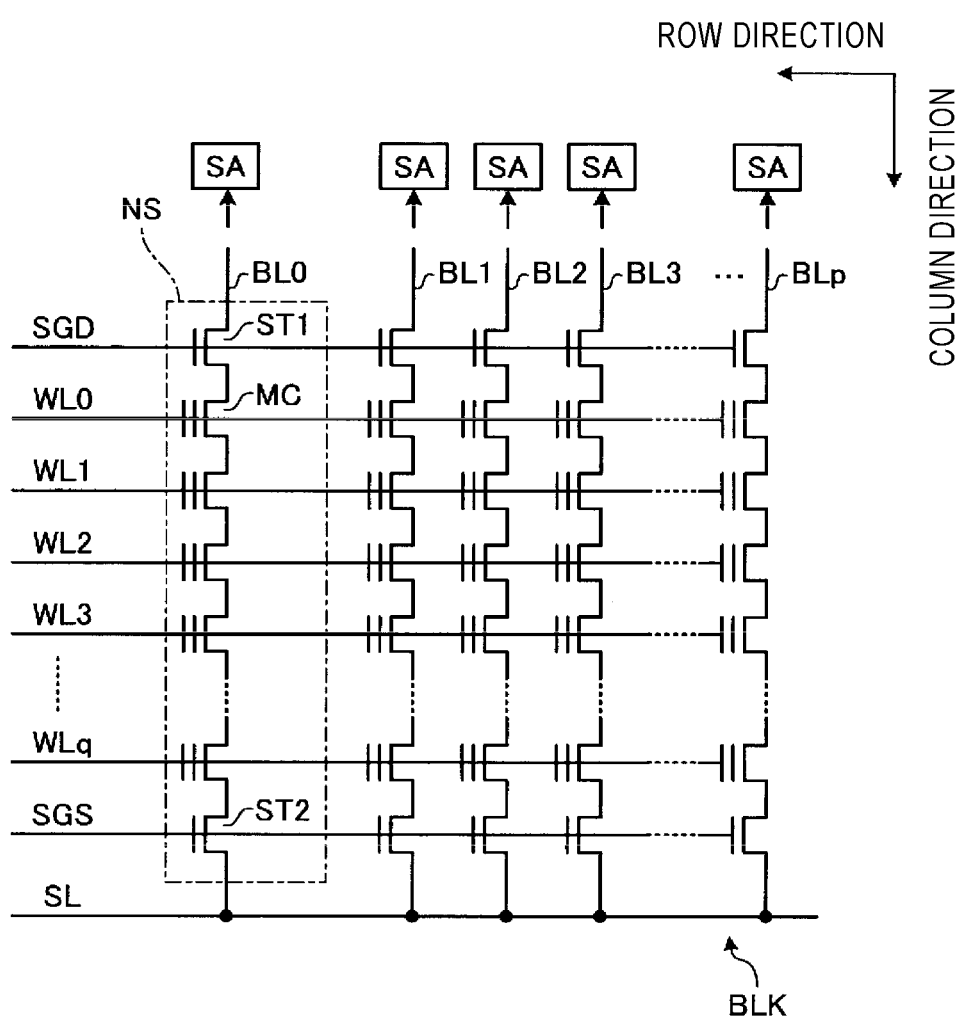
FIG. 4 is a circuit diagram illustrating a configuration example of one block in the memory chip of the NAND memory according to the first embodiment.

FIG. 4 is a circuit diagram illustrating a configuration example of one block BLK in the memory chip 31 of the NAND memory 3 according to the first embodiment.

Each block BLK includes (p+1) NAND strings NS (p is an integer of zero or more) arranged in order in the row direction.

Each NAND string NS includes select transistors ST1 and ST2. In the select transistor ST1, a drain is connected to one of the bit lines BL0 to BLp and a gate is commonly connected to a select gate line SGD. Further, in the select transistor ST2, a source is commonly connected to a source line SL and a gate is commonly connected to a select gate line SGS.

Each memory cell MC includes a metal oxide semiconductor field effect transistor (MOSFET) having a stacked gate structure formed on a semiconductor substrate. The stacked gate structure includes a charge storage layer (also referred to as a floating gate electrode) formed on the semiconductor substrate with a gate insulating film interposed therebetween, and a control gate electrode formed on the charge storage layer with an inter-gate insulating film interposed therebetween. In the memory cell MC, threshold voltage changes in accordance with the number of electrons stored in the floating gate electrode, and the data stored therein is distinguished according to a difference in threshold voltage. The memory cell MC is not limited to a structure having the floating gate electrode, and another structure may be adopted, in which the threshold voltage may be adjusted by trapping electrons in a nitride film interface that functions as a charge storage layer, such as a metal-oxide-nitride-oxide-silicon (MONOS) type. Further, the memory cell MC may be configured as a single-level cell (SLC) or a multi-level cell (MLC).

In each NAND string NS, (q+1) memory cells MC are arranged between the source of the select transistor ST1 (q is an integer of zero or more) and the drain of the select transistor ST2 so that respective current paths are connected in series. That is, the plurality of memory cells MC is connected in series in the column direction in such a manner that adjacent memory cells share a diffusion region (a source region or a drain region).

In each NAND string NS, a control gate electrode is connected to word lines WL0 to WLq in order from the memory cell MC located closest to the select gate line SGD. Therefore, the drain of the memory cell MC connected to the word line WL0 is connected to the source of the select transistor ST1, and the source of a memory cell MC connected to the word line WLq is connected to the drain of the select transistor ST2.

The word lines WL0 to WLq commonly connect the control gate electrodes of the memory cell MCs between the NAND strings NS in the block BLK. That is, the control gate electrodes of the memory cells MC in the same row in the block BLK are connected to the same word line WL. (P+1) memory cells MC connected to the same word line WL are defined as a memory cell group corresponding to one or plural physical pages, and data writing and data reading are performed on per physical page basis.

The bit lines BL0 to BLp are connected in common to the drains of the select transistors ST1 across the blocks BLK.

That is, the NAND strings NS in the same column in the plurality of blocks BLK are connected to the same bit line BL.

(Example of Threshold Voltage Distribution of Memory Cells)

Figure 5:
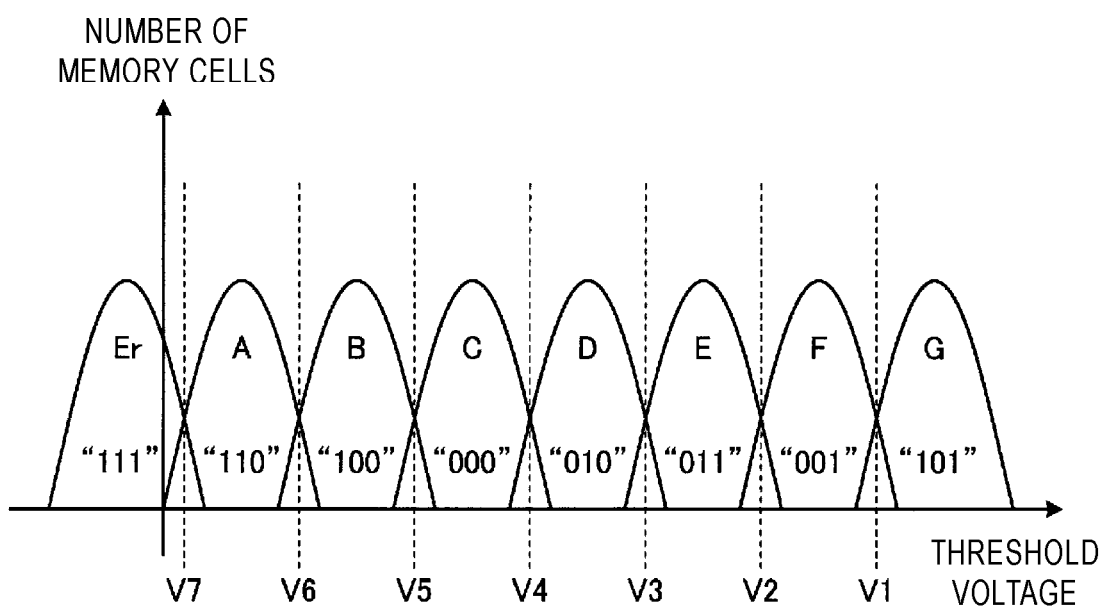
FIG. 5 is a diagram illustrating a threshold voltage distribution of a memory cell according to the first embodiment.

The threshold voltage distribution of the memory cells MC operating in a TLC mode is illustrated, for example, in FIG. 5. FIG. 5 is a diagram illustrating a threshold voltage distribution of memory cells MC according to the first embodiment. In FIG. 5, the horizontal axis represents the threshold voltage and the vertical axis represents the number of memory cells MC (specifically, the number of memory cells MC which represent a predetermined bit value).

According to the TLC mode, each memory cell MC may hold eight-value data "xyz" defined by data "x" belonging to an upper page, data "y" belonging to a middle page, and data "z" belonging to a lower page. Values of data "x", data "y", and data "z" are "0" or "1". The threshold voltage of each memory cell MC is controlled to belong to one of eight groups of distributions Er, A, B, C, D, E, F, and G. A correspondence between each distribution and the value of the eight-value data "xyz" is predefined. For example, a value "111" is assigned to the distribution Er. A value "110" is assigned to the distribution A. A value "100" is assigned to the distribution B. A value "000" is assigned to the distribution C. A value "010" is assigned to the distribution D. A value "011" is assigned to the distribution E. A value "001" is assigned to the distribution F. A value "101" is assigned to the distribution G. However, the correspondence between each distribution and the data value is not limited thereto.

Upon receiving a write command from the host 4 via the memory controller 2, the serializer/deserializer S/D selects and activates a bit line BL designated by a column address which corresponds to a received block address. The sense amplifier SA sets a potential of the bit line BL selected by the serializer/deserializer S/D to 0 V. The row decoder RD applies a programming pulse to a word line WL corresponding to a row address obtained by decoding the block address. Then, electrons are injected into a floating gate of the memory cell MC located at an intersection between the selected bit line BL and the selected word line WL, and as a result, the threshold voltage of the memory cell MC rises. Each time the programming pulse is applied, the sense amplifier module SAM checks whether the threshold voltage reaches a voltage corresponding to data stored in the data register XDL. The sense amplifier SA continuously applies the program pulse to the row decoder RD until the threshold voltage reaches the voltage corresponding to the data.

Upon receiving a read command from the host 4 via the memory controller 2, the sense amplifier module SAM precharges the bit line BL to the bit line voltage Vb1 (e.g., 1.5 V), and the row decoder RD sequentially applies plural types of determination voltages (read voltages) that specify the distribution for each data value to the selected word line WL. Further, the row decoder RD applies read pass voltages to an unselected word lines WL and brings memory cells MC which are connected to the unselected word line WLs into a conductive state. The sense amplifier SA detects which read voltage is applied when charges stored by the precharging flow to a source line SL, thus determining the data value stored in the target memory cell MC.

In the example of FIG. 5, the ranges of the distributions of threshold voltages of the memory cells MC that belong to respective distributions Er and A to G overlap with each other. That is, for example, the maximum value of the threshold voltage of the memory cell MC which belongs to the distribution A is more than the determination voltage V7 and a minimum value of the threshold voltage of the memory cell MC which belongs to the distribution B is lower than the determination voltage V7. When reading the memory cell MC which belongs to the distribution A and has the threshold voltage higher than the determination voltage V7, it is recognized that the memory cell MC belongs to the distribution B. That is, the data written as "110" is read as "100". When reading the memory cell MC which belongs to the distribution B and has the threshold voltage lower than the determination voltage V7, it is recognized that the memory cell MC belongs to the distribution A. That is, the data written as "100" is read as "110".

An error caused by the memory cell MC having threshold voltage in the vicinity of the determination voltage may be corrected by an error correcting code (ECC) circuit included in the memory controller 2, for example. However, there is a limit in the number of error bits which the memory controller 2 can correct through the ECC circuit. Thus, the voltage value in which the total number of memory cells MC between two adjacent distributions is the minimum is used as the determination voltage, for example, so that the number of error bits in the read data does not exceed the limit. As a result, the number of errors in the read data can be reduced.

For example, determination voltage V7 is set between the distribution Er and the distribution A. Determination voltage V6 is set between the distribution A and the distribution B. Determination voltage V5 is set between the distribution B and the distribution C. Determination voltage V4 is set between the distribution C and the distribution D. Determination voltage V3 is set between the distribution D and the distribution E. Determination voltage V2 is set between the distribution E and the distribution F. Determination voltage V1 is set between the distribution F and the distribution G.

The amount of overlap of the threshold voltages might become larger as a result of program disturb, read disturb, temperature cross and the like.

Figure 6:
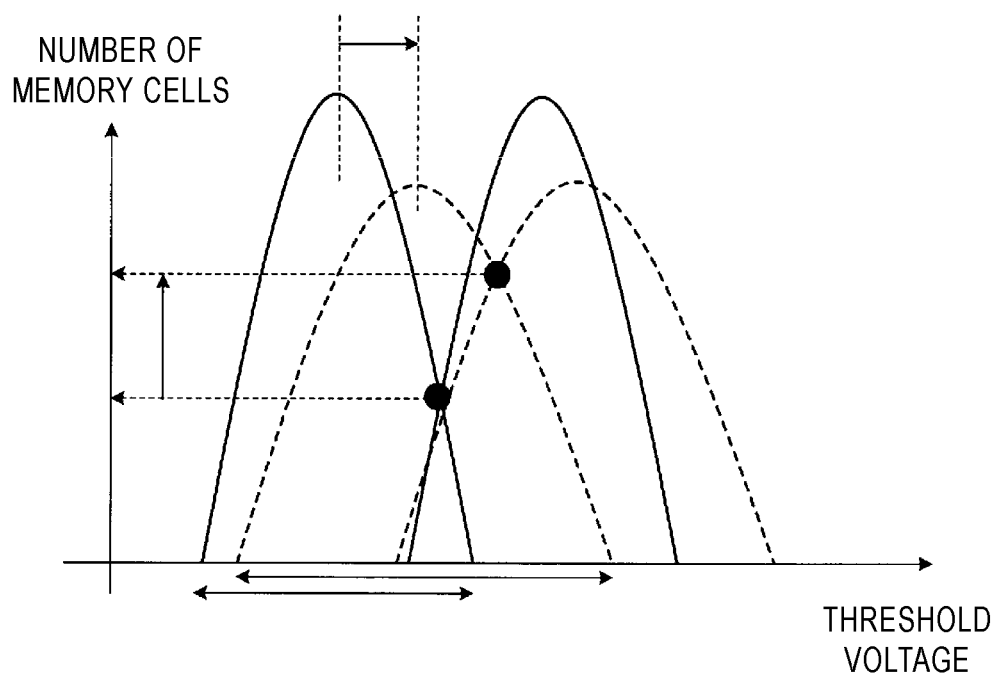
FIG. 6 is a diagram illustrating a threshold voltage distribution of a memory cell affected by a temperature cross.

Here, a temperature cross of the memory cells will be described with reference to FIG. 6. FIG. 6 is a diagram illustrating threshold voltage distributions of memory cells having a temperature cross. In FIG. 6, the horizontal axis represents the threshold voltage and the vertical axis represents the number of memory cells. In FIG. 6, among the threshold voltage distributions of memory cells, only threshold voltage distributions of memory cells which belong to two distributions are illustrated. Further, a solid line of FIG. 6 indicates the threshold voltage distribution of the memory cells when data is written at a high temperature and read at the high temperature. A broken line of FIG. 6 indicates the threshold voltage distribution of the memory cells when data is written at a high temperature and read at a low temperature.

As represented by the broken line in FIG. 6, the threshold voltage of the memory cell when the data is written at the high temperature and read at the low temperature becomes higher than the threshold voltage of the memory cells when the data is written at the high temperature and read at the high temperature. In addition, the threshold voltage distribution of the memory cells when the data is written at the high temperature and read at the low temperature varies more greatly than the threshold distribution of the memory cells when the data is written at the high temperature and read at the high temperature. Such difference in threshold voltage distribution of memory cells depending on the temperature of writing and reading is referred to herein as the temperature cross.

As described above, when the threshold voltage of the memory cell shifts when the data is read at the low temperature, the minimum point of the overlap between the distributions deviates along the horizontal axis (i.e., threshold voltage) and thus the optimum determination voltage shifts. Since the shift amount might vary greatly among the memory cells, it would not be possible to read intended data merely by changing the read voltage. When the shift amount varies for each memory cell, the minimum points of the overlap between the distributions deviate along the vertical axis (i.e., the number of memory cells MC) and the overlapping portion between the distributions increases. When the overlapping portion between the distributions increases, the number of error bits might increase and the error correction limit of the error correction circuit might be exceeded.

Accordingly, in the memory system 1 of the first embodiment, upon receiving a read command or the like from the host 4, the memory controller 2 determines whether the operation target memory chip 31 is at or above a predetermined temperature. When the memory chip 31 is below the predetermined temperature, the memory controller 2 issues a warming command. The NAND memory 3 performs the warming operation according to the received warming command. The warming operation of the first embodiment can be applied not only to the case where a read command is received from the host 4 but also to all access commands such as a write command and an erase command. Hereinafter, details of the warming operation of the NAND memory 3 will be described.

(Example of Warming Operation of Memory Chip)

Figure 7:
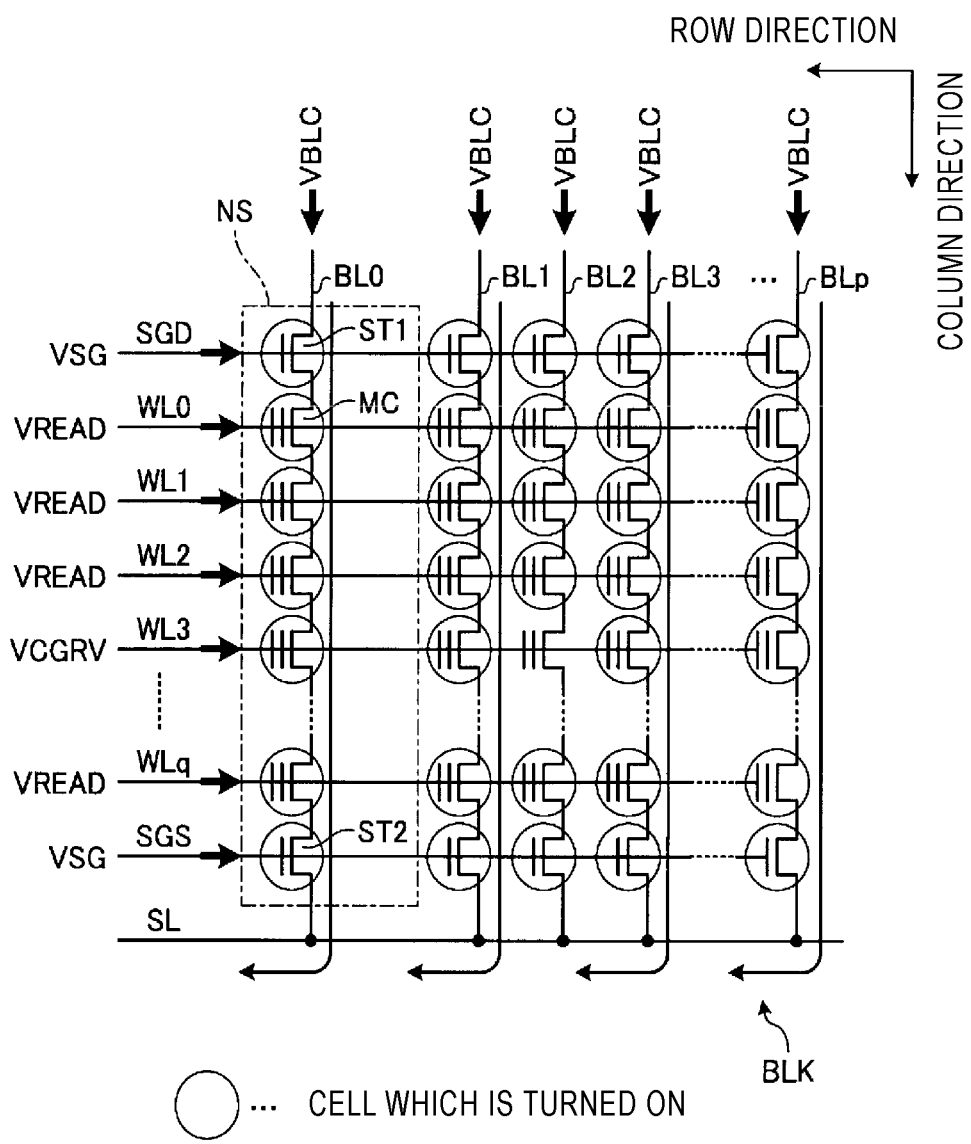
FIG. 7 is a schematic diagram for describing a warming operation of a NAND memory according to the first embodiment.

The warming operation of the NAND memory 3 will be described with reference to FIG. 7. FIG. 7 is a schematic diagram for describing a warming operation of a NAND memory 3 according to the first embodiment.

The warming operation of the NAND memory 3 illustrated in FIG. 7 may be performed, for example, by modifying a normal reading operation. Such a modification may include a feature that data is not processed. That is, sensing by the sense amplifier SA is not performed.

When the operation target memory chip 31 is below the predetermined temperature, the memory controller 2 issues the warming command to raise the temperature of the memory chip 31. In the example of FIG. 7, the warming command is a command to cause the NAND memory 3 to continue the warming operation for a predetermined time.

Upon receiving the warming command, the NAND memory 3 applies a predetermined voltage to the word lines WL, the select gate lines SGD and SGS, and the bit lines BL within the block BLK in which the warming operation is to be performed among the plurality of blocks BLKs in the memory chip 31 that is the warming target.

Voltage VCGRV, which is a read voltage, is applied to the word line WL connected to the memory cell MC that is the read target of the normal read operation. The memory cell MC may be selected as desired, such as a memory cell MC located at a center of the NAND string NS. As a result, at least some memory cells MC are turned on in accordance with the data held in the memory cells MC.

Voltage VREAD, which is voltage for non-selected word lines WL, is applied to other word lines WL. The voltage VREAD is voltage at which the memory cell MC is turned on regardless of the data held by the memory cell MC.

Voltage VSG at which the select transistors ST1 and ST2 are turned on is applied to each of the gate lines SGD and SGS.

Voltage VBLC which is voltage at the time of precharging bit lines BL as part of the normal read operation is applied to bit lines BL. As described above, in the NAND string NS that includes a memory cell MC turned on by the application of voltage VCGRV, a current path from the bit line BL to the source line SL is formed and current flows from the bit line BL to the source line SL.

As described above, the current flows through at least some bit lines BL within the block BLK, and as a result, Joule heat is generated and the temperature of the memory chip 31 including the block BLK is raised. The NAND memory 3 continues application of predetermined voltage to the word lines WL, the select gate lines SGD and SGS, and the bit lines BL for a predetermined time. The memory controller 2 acquires the temperature information from the NAND memory 3 after each predetermined period during the warming operation of the NAND memory 3, and causes the NAND memory 3 to continue the warming operation until the temperature of the memory chip 31 becomes equal to or higher than the predetermined temperature. In this case, the predetermined temperature may be set according to the specification of the NAND memory 3.

The voltage applied to the non-selected word lines WL may be set to be higher than the voltage VREAD which is the normal read voltage. In addition, the voltage applied to the bit line BL may be set to be higher than the voltage VBLC which is the normal precharge voltage.

Here, the following method may be adopted to make the current flow through more bit lines BL.

As another method, all of the word lines WL may be non-selected without specifying a memory cell MC to be read in a normal operation. That is, the voltage VREAD is applied to all word lines WL. As a result, all memory cells MC in the block BLK are turned on irrespective of the data held thereby. Therefore, the current flows through all bit lines BL in the block BLK.

In this case, the voltage applied to the word lines WL may be set to be higher than VREAD, the voltage applied to the bit lines BL may be set to be higher than the voltage VBLC, or both of these may be performed.

The block BLK to be subjected to the warming operation may be a predetermined block BLK among plural blocks BLK in the operation target memory chip 31, for example, among free blocks, defective blocks, and the like. The free block is a block BLK in which valid data does not exist. The defective block is a block BLK determined to be invalid, for example, due to a high error rate. The block BLK used for the warming operation may be previously configured in each memory chip 31. Upon issuing the warming command, the memory controller 2 may designate the block BLK.

In the above description, a predetermined temperature as a target of the warming operation is set according to the specifications of the NAND memory 3, but is not limited thereto. For example, the memory controller 2 may store temperature at the time of data writing, and the predetermined temperature may be set so that the temperature at the time of writing is the same as the temperature at the time of reading. Further, for example, the predetermined temperature may be set in the NAND memory 3 as a fixed value in advance. In this case, the NAND memory 3 raises the temperature of the memory chip 31 up to the predetermined temperature by referring to the fixed value without the time of the warming operation being specified by the memory controller 2.

(Sequence Example of Warming Command)

Figure 8:
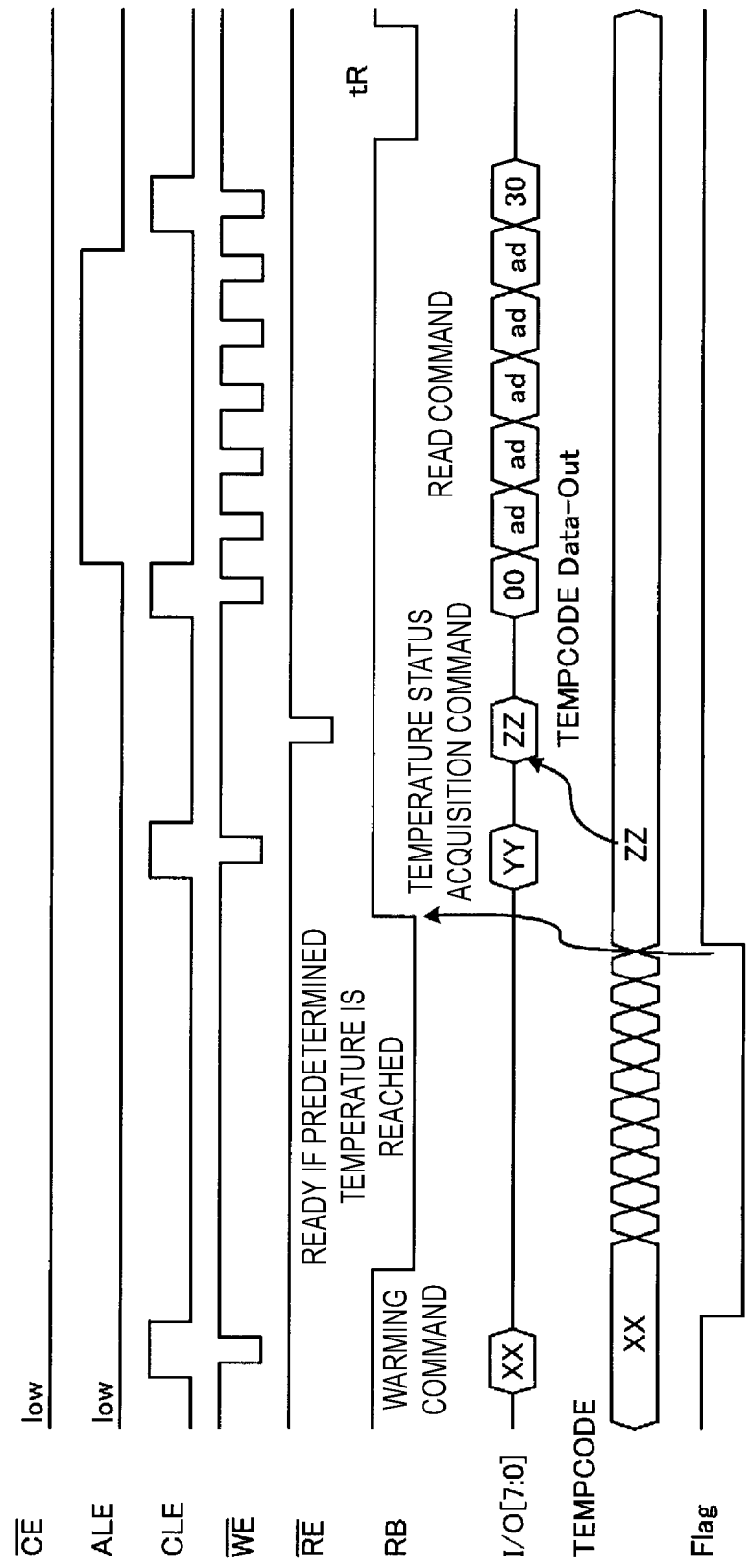
FIG. 8 is a diagram illustrating an example of waveforms of various signal lines when a memory controller issues a warming command according to the first embodiment.

Next, a sequence example of the memory system 1 at the time of issuing the warming command will be described with reference to FIG. 8. FIG. 8 is a diagram illustrating an example of waveforms of various signal lines when a memory controller 2 issues a warming command according to the first embodiment. In FIG. 8, among various signal lines, a signal line with an overbar indicates a signal line which is asserted when the signal line is at a low level.

A chip enable signal CE is a signal that enables the NAND memory 3 to receive signals. In the sequence example of FIG. 8, the chip enable signal CE is maintained at the low level. Input/output signal I/O contains data transmitted and received between the NAND memory 3 and the memory controller 2 and include eight signals (one signal per bit) indicating commands, addresses, write data, read data, and the like.

As illustrated in FIG. 8, when requesting a predetermined access command, the memory controller 2 issues the warming command when the temperature of the operation target memory chip 31 is less than the predetermined value. At this time, a command latch enable signal CLE which notifies the NAND memory 3 that the input signal I/O contains a command is transitioned to a high level. Further, in this case, a write enable signal WE which brings the input signal I/O into the NAND memory 3 is transitioned to a low level.

Upon receiving the warming command, the NAND memory 3 starts the warming operation and continues the warming operation until a predetermined time elapses. The NAND memory 3 asserts a flag when the predetermined time elapses. The flag in FIG. 8 is a signal indicating that the warming operation is performed for the predetermined time in conjunction with a ready busy signal RB. In FIG. 8, an initial state of the flag is set to the high level, but the initial state may be the low level. Asserting the flag results in the ready busy signal RB, which indicates a state in which the NAND memory 3 is ready to receive a command from the memory controller 2 (ready state) or not (busy state), being transitioned to the high level corresponding to the ready state.

When the NAND memory 3 is in the ready state, the memory controller 2 issues a temperature status acquisition command to acquire the temperature information of the operation target memory chip 31. At this time, the command latch enable signal CLE is transitioned to the high level and the write enable signal WE is transitioned to the low level.

Upon receiving the temperature status acquisition command, the NAND memory 3 transmits a temperature information signal TEMPCODE to the memory controller 2. At this time, a read enable signal RE that reads the output signal I/O from the NAND memory 3 is transitioned to the low level (i.e., valid).

The memory controller 2 receives the temperature information signal TEMPCODE and determines whether the temperature of the memory chip 31 is equal to or higher than the predetermined temperature. When the temperature of the memory chip 31 is equal to or higher than the predetermined temperature, a command is executed in the NAND memory 3. In the example of FIG. 8, a read command and an address of the read destination are transmitted to the NAND memory 3. At the time of transmitting the read command, the command latch enable signal CLE is transitioned to the high level and the write enable signal WE is transitioned to the low level. At the time of transmitting the address of the read destination, an address latch enable signal ALE that notifies the NAND memory 3 that the input signal I/O is an address is transitioned to the high level. Further, in this case, the write enable signal WE is transitioned to the low level (i.e., valid).

The NAND memory 3 starts reading from the memory cell MC corresponding to the address of the read destination and sets the ready busy signal RB to the low level (busy state) until the read operation ends.

By the above description, the sequence of the memory system 1 at the time of issuing the warming command ends.

(Example of Warming Operation in Memory System)

Figure 9:
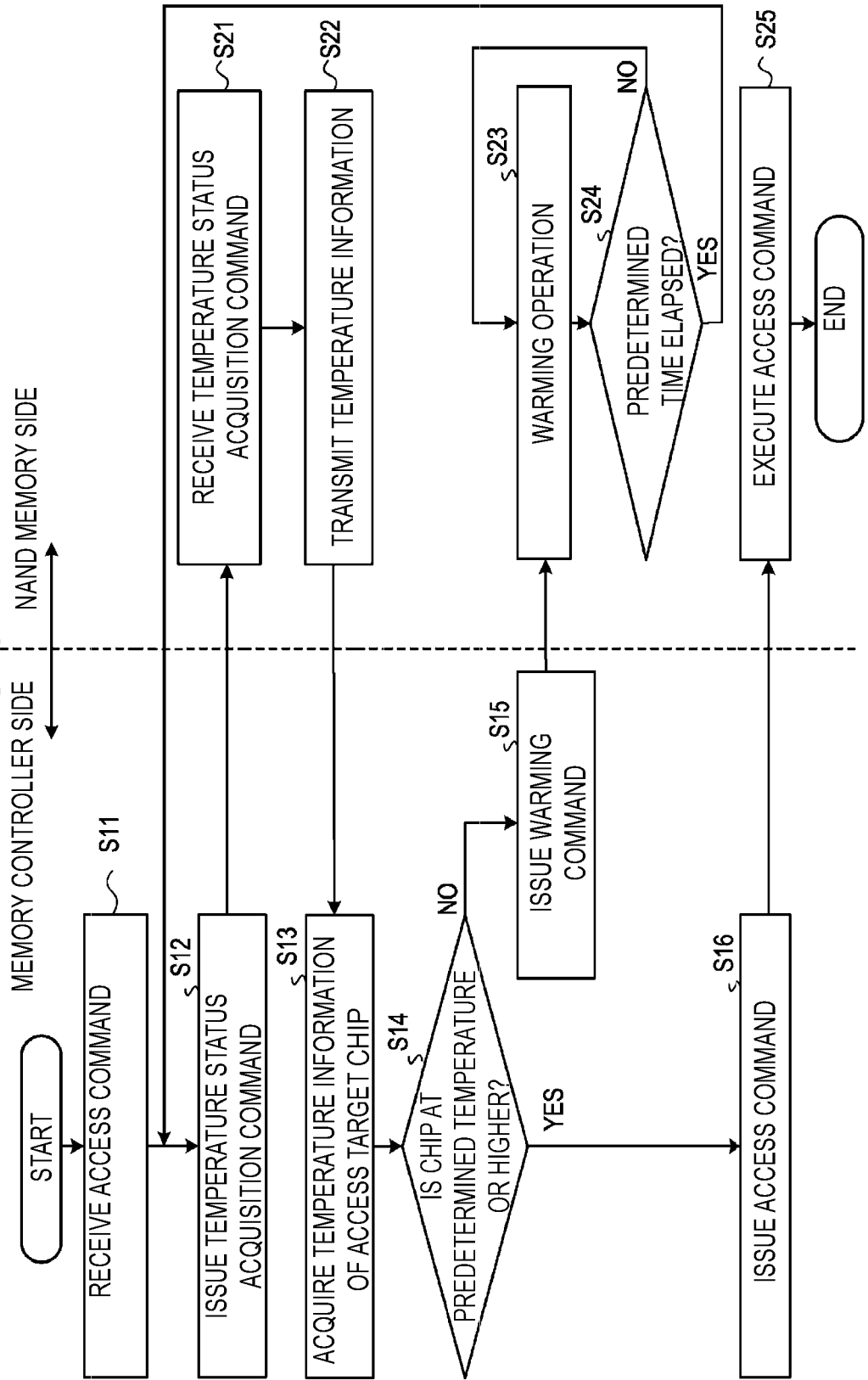
FIG. 9 is a flowchart illustrating an example of a sequence of the warming operation in the memory system according to the first embodiment.

Next, an example of a warming operation in the memory system 1 will be described with reference to FIG. 9. FIG. 9 is a flowchart illustrating an example of a sequence of a warming operation in the memory system 1 according to the first embodiment.

As illustrated in FIG. 9, the memory controller 2 receives an access command from the host 4 (step S11). The access command is, for example, a command of instructing writing, reading, erasing, and the like with respect to the NAND memory 3. The temperature information acquisition unit 23c of the memory controller 2 issues a temperature status acquisition command to the NAND memory 3 according to the access command and obtains the temperature information of the access target memory chip 31 (step S12).

Upon receiving the temperature status acquisition command (step S21), the NAND memory 3 detects the temperature of the access target memory chip 31 by the temperature sensor 31s of the access target memory chip 31. The NAND memory 3 transmits the detected temperature as temperature information to the memory controller 2 (step S22).

When the temperature information acquisition unit 23c acquires the temperature information of the access target memory chip 31 (step S13), the temperature information determining unit 23d determines whether the temperature of the memory chip 31 is equal to or higher than a predetermined temperature (step S14). When the temperature of the memory chip 31 is equal to or higher than the predetermined temperature ("Yes" in step S14), the process proceeds to step S16. When the temperature of the memory chip 31 is lower than the predetermined temperature ("No" in step S14), the access processing unit 23a issues the warming command to the NAND memory 3 (step S15).

Upon receiving the warming command, the NAND memory 3 starts the warming operation in the block BLK to be subjected to the warming operation among the blocks BLK in the access target memory chip 31 (step S23). The NAND memory 3 appropriately determines whether a predetermined time elapses from the start of the warming operation (step S24). While the predetermined time from the start of the warming operation has not elapsed ("No" in step S24), the NAND memory 3 continues the warming operation (step S23). When the predetermined time or more has elapsed from the start of the warming operation ("Yes" in step S24), the NAND memory 3 goes into the ready state (to step S12).

When the NAND memory 3 is in the ready state, the temperature information acquisition unit 23c issues the temperature status acquisition command again (step S12) and determines whether the acquired temperature information is equal to or higher than the predetermined temperature (steps S13 and S14). When the temperature of the memory chip 31 is lower than the predetermined temperature ("No" in step S14), the process proceeds to step S15. When the temperature of the memory chip 31 is equal to or higher than the predetermined temperature ("Yes" in step S14), the access processing unit 23a issues the access command to the NAND memory 3 (step S16).

According to the access command from the memory controller 2, the NAND memory 3 executes predetermined operations such as writing, reading, and erasing (step S25).

By the above description, the warming operation in the memory system 1 ends.

In place of step S24 in the flowchart of FIG. 9, the NAND memory 3 may continue the warming operation until a predetermined temperature is reached. In such a case, the NAND memory 3 executes step S25 when the predetermined temperature is reached and the temperature redetermination (steps S12 to S14) by the memory controller 2 need not be performed.

Comparative Example

The NAND memory of a comparative example does not support the warming command. In such a NAND memory, reading precision deteriorates due to the temperature cross. The temperature cross is caused, for example, when an environmental temperature at which the NAND memory is placed differs between writing and reading. As another example in which the temperature cross is caused, for example, data written when the NAND memory is at a high temperature due to heat generation by continuous processing is read from the NAND memory which is in a low temperature state after a predetermined nonuse period.

In the memory system 1 of the first embodiment, when the NAND memory 3 is in a low temperature state, the memory controller 2 issues the warming command to cause the NAND memory 3 to perform the warming operation. As a result, it is possible to prevent performing a process such as reading from the NAND memory 3 in a low temperature state and to prevent deteriorating a read accuracy induced by the temperature cross.

In the memory system 1 of the first embodiment, for example, the voltage VCGRV is applied to a predetermined word line WL of a predetermined block BLK, and the voltage VREAD is applied to other word lines WL, in the warming operation. Thus, the current may flow through at least some bit lines BL, and the temperature of the predetermined memory chip 31 may be raised by the current flowing on the bit line BL.

In the memory system 1 of the first embodiment, voltage higher than the voltage VREAD may be applied to the other word lines WL in the warming operation. As a result, the temperature of the memory chip 31 can be more rapidly raised.

In the memory system 1 of the first embodiment, voltage higher than the voltage VBLC may be applied to the bit lines BL in the warming operation. As a result, of the temperature of the memory chip 31 can be more rapidly raised.

In the memory system 1 of the first embodiment, the voltage VREAD may be applied to all word lines WL of the predetermined block BLK in the warming operation. As a result, the current may flow through all bit lines BL in the block BLK and the temperature of the memory chip 31 can be more rapidly raised.

In the memory system 1 of the first embodiment, the block BLK which becomes the target of the warming operation may be selected from a group including free blocks and defective blocks. In the warming operation, since the voltage is applied to each wire, read disturb in which the threshold voltage gradually decreases might be caused. However, in the case of the free block or the defective block, the warming operation can be performed without worrying about an influence of the read disturb.

In the memory system 1 of the first embodiment, the warming operation may be performed so that the temperature in writing and the temperature in reading become equal to each other. As a result, it is possible to further reduce the occurrence of the temperature cross.

In the memory system 1 of the first embodiment, for example, the warming operation may be executed even in writing and erasing. As a result, a writing operation and an erasing operation can be rapidly performed and wear-out of the memory cell can be prevented.

Second Embodiment

A memory system according to a second embodiment will be described with reference to FIGS. 10 to 12. In the memory system of the second embodiment, the warming operation of the NAND memory in response to the warming command from the memory controller is different from the warming operation of the first embodiment described above. In the warming operation according to the second embodiment, data is repeatedly transmitted in a predetermined circuit which belongs to the memory chip of a warming target so as to increase the temperature of the memory chip.

Figure 10:
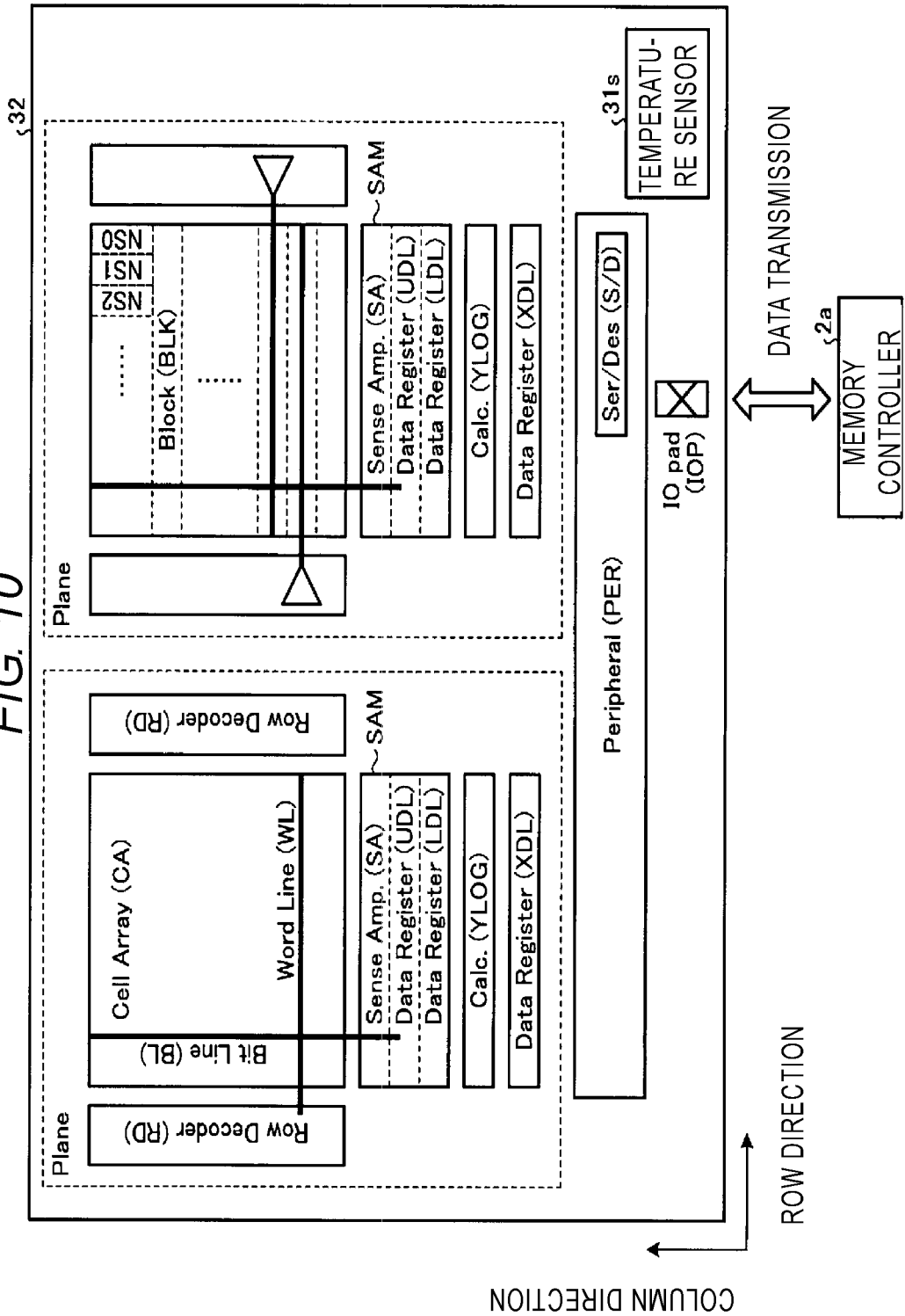
FIG. 10 is a block diagram illustrating a configuration example of a memory chip in a NAND memory according to a second embodiment.

FIG. 10 is a block diagram illustrating a configuration example of a memory chip 32 in a NAND memory according to the second embodiment. The NAND memory according to the second embodiment causes the memory chip 32 to perform the warming operation in response to a warming command from a memory controller 2a.

As illustrated in FIG. 10, in the warming operation according to the second embodiment, in the memory chip 32 of the warming target, data transmission is repeated through the input/output pad IOP serving as an input/output circuit to increase the temperature of the memory chip 32.

Specifically, the input/output pad IOP in the memory chip 32 which is the warming target transmits and receives data transmitted from the memory controller 2a without transferring the transmitted data to the cell array CA. That is, the data transmission is repeated between the input/output pad IOP and the memory controller 2a. The transmitted data may be any data such as, for example, dummy data.

The data transmission is repeated as described above, and as a result, the input/output pad IOP generates heat and the temperature of the entire memory chip 32 having the input/output pad IOP can be raised up to a predetermined temperature.

The predetermined temperature which becomes a target of the warming operation may be stored in the NAND memory as a fixed value in advance. Alternatively, at the time of issuing the warming command, the memory controller 2a may set the predetermined temperature. In this case, the predetermined temperature may be set so that the same temperature is maintained in writing and reading. Further, in this case, the memory controller 2a may acquire the temperature information from the NAND memory at regular intervals during the warming operation of the NAND memory and cause the NAND memory to continue the warming operation until the temperature of the memory chip 32 becomes the predetermined temperature or more.

As described above, in the memory system of the second embodiment, only the specific contents of the warming operation are different from those of the memory system 1 of the first embodiment, and other configurations are the same as those of the memory system 1 of the first embodiment. A waveform diagram of various signal lines illustrated in FIG. 7 and the flowchart of the warming operation illustrated in FIG. 8 may be applied even to the configuration of the second embodiment.

(First Modification)

A memory system according to a first modification of the second embodiment will be described with reference to FIG. 11. The memory system according to the first modification of the second embodiment is different from that of the second embodiment in that the serializer/deserializer S/D serving as a conversion unit is caused to perform serial/parallel conversion of data in the warming operation.

Figure 11:
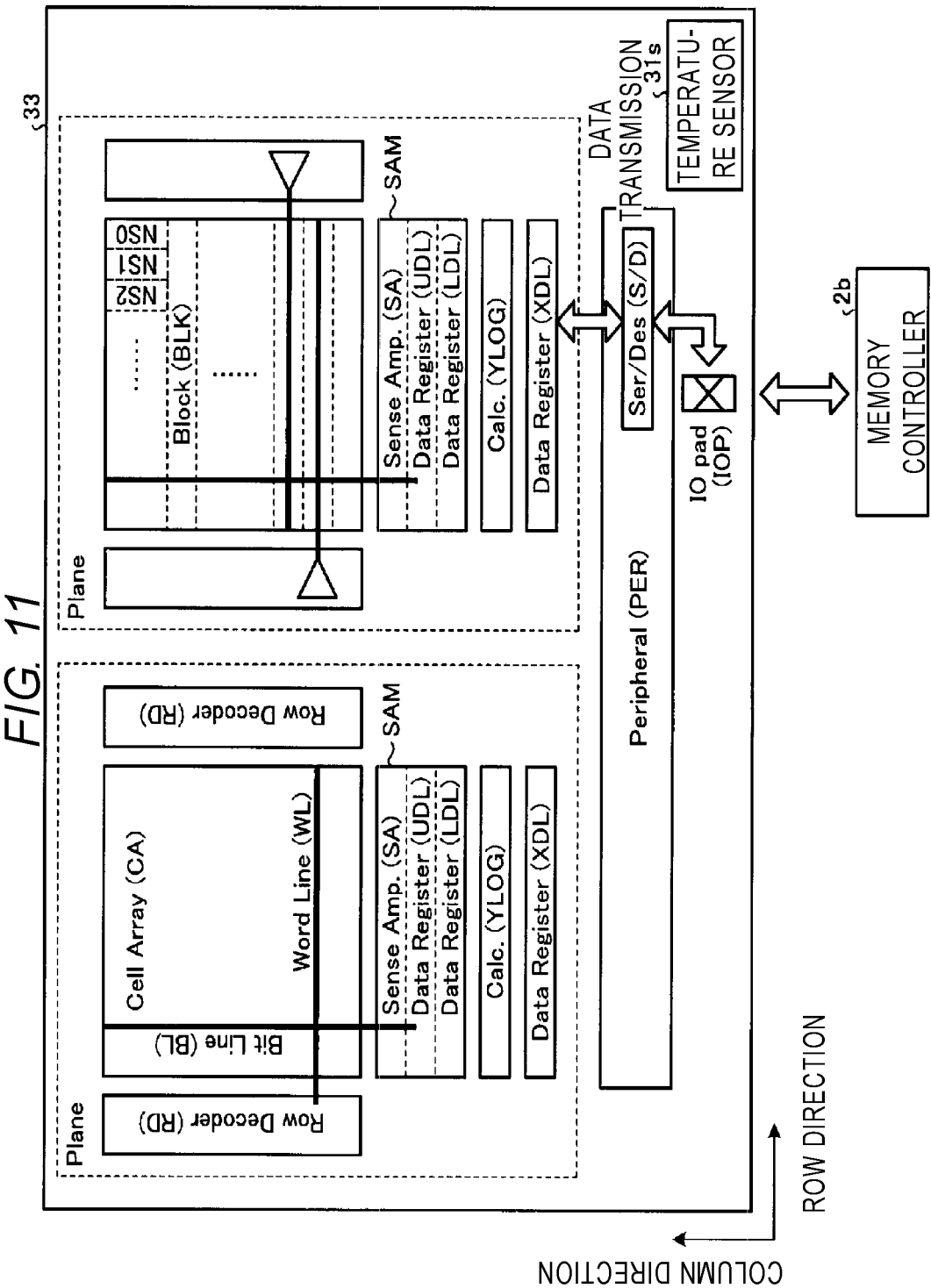
FIG. 11 is a block diagram illustrating a configuration example of a memory chip in a NAND memory according to a first modification of the second embodiment.

FIG. 11 is a block diagram illustrating a configuration example of a memory chip 33 in a NAND memory according to the first modification of the second embodiment. The NAND memory according to the first modification of the second embodiment causes the memory chip 33 to perform the warming operation in response to the warming command from a memory controller 2b.

As illustrated in FIG. 11, the serializer/deserializer S/D in the memory chip 33 which is the warming target performs a serial/parallel conversion of data transmitted from the memory controller 2b without transferring the data to the cell array CA. That is, the serializer/deserializer S/D converts the data of serial signals received from the memory controller 2b via the input/output pad IOP to parallel signals and transfer the data to the data register XDL belonging to the predetermined block BLK of the cell array CA. Further, data of the parallel signals transmitted to the data register XDL is converted into serial signals and transmitted to the memory controller 2b via the input/output pad IOP. The predetermined block BLK may be a block BLK which becomes a target of an access command from the host 4. The transmitted data may be any data, for example, dummy data such as "10101010".

The serial/parallel conversion is repeated while transmitting and receiving the data as described above, so that the serializer/deserializer S/D generates heat and the temperature of the entire memory chip 33 having the serializer/deserializer S/D can be raised up to the predetermined temperature.

(Second Modification)

Next, a memory system according to a second modification of the second embodiment will be described with reference to FIG. 12. The memory system according to the second modification of the second embodiment is different from that of the second embodiment in that exchange of data is performed between the data registers UDL and LDL serving as latches, for example, as the warming operation.

Figure 12:
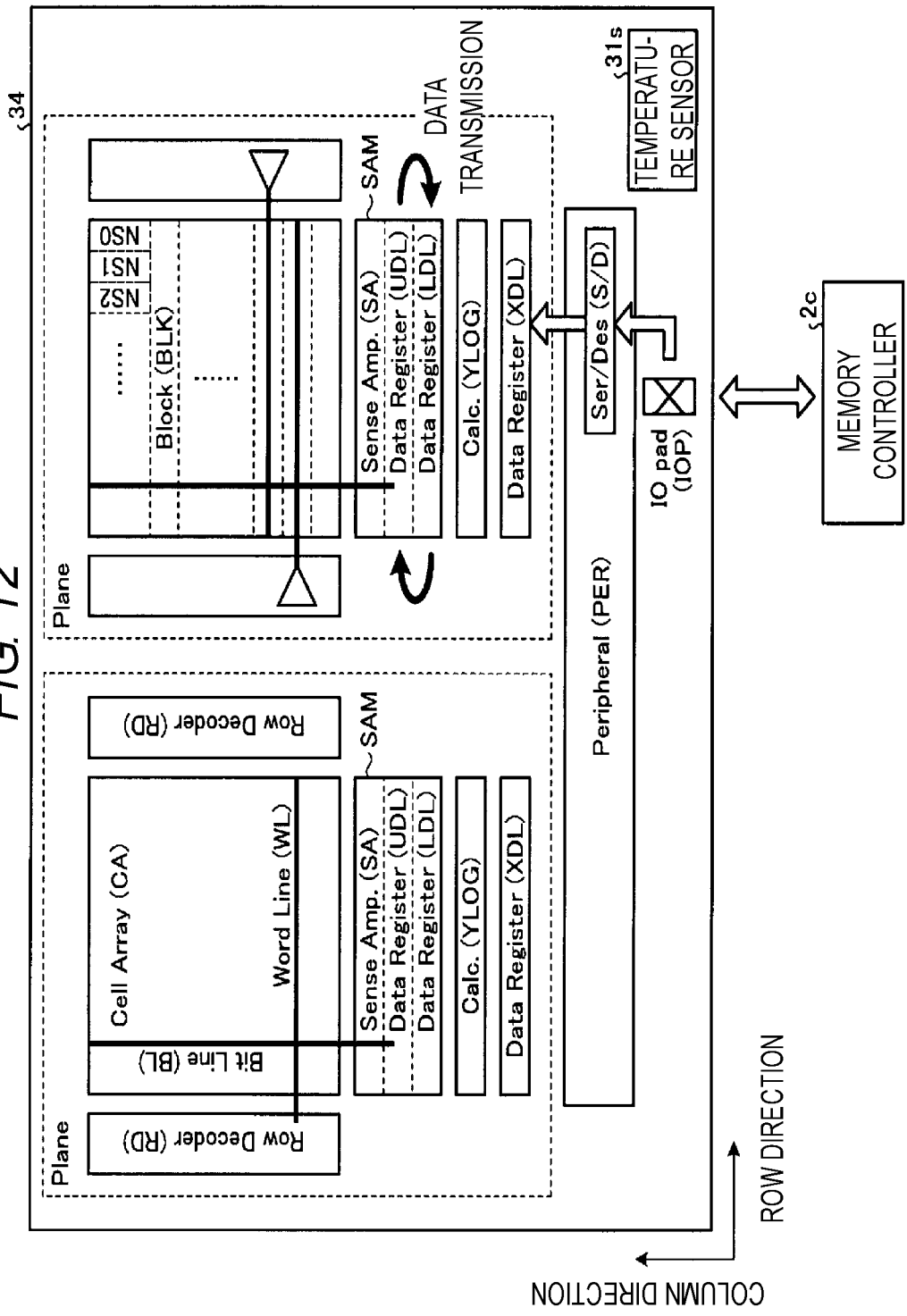
FIG. 12 is a block diagram illustrating a configuration example of a memory chip in a NAND memory according to a second modification of the second embodiment.

FIG. 12 is a block diagram illustrating a configuration example of a memory chip 34 in a NAND memory according to the second modification of the second embodiment. The NAND memory according to the second modification of the second embodiment causes the memory chip 34 to perform the warming operation in response to the warming command from a memory controller 2c.

As illustrated in FIG. 12, the data registers UDL and LDL belonging to a predetermined block BLK in the memory chip 34 which is the warming target exchange data with each other. The predetermined block BLK may be a block BLK which becomes a target of an access command from the host 4. The data may be data held by at least one of the data registers UDL and LDL. The data may be data transmitted from the memory controller 2c or may be a dummy data set "11111111" or "00000000". The alteration of the data may be performed in the arithmetic logical circuit YLOG performing an operation such as inversion of data.

The data transmission is repeated as described above, and as a result, the data registers UDL and LDL generate heat and the temperature of the entire memory chip 34 having the data registers UDL and LDL can be raised up to a predetermined temperature.

Third Embodiment

The memory system 1 of the first embodiment, and the memory systems of the second embodiment, and the first and second modifications may be applied to, for example, a storage system.

Figure 13:
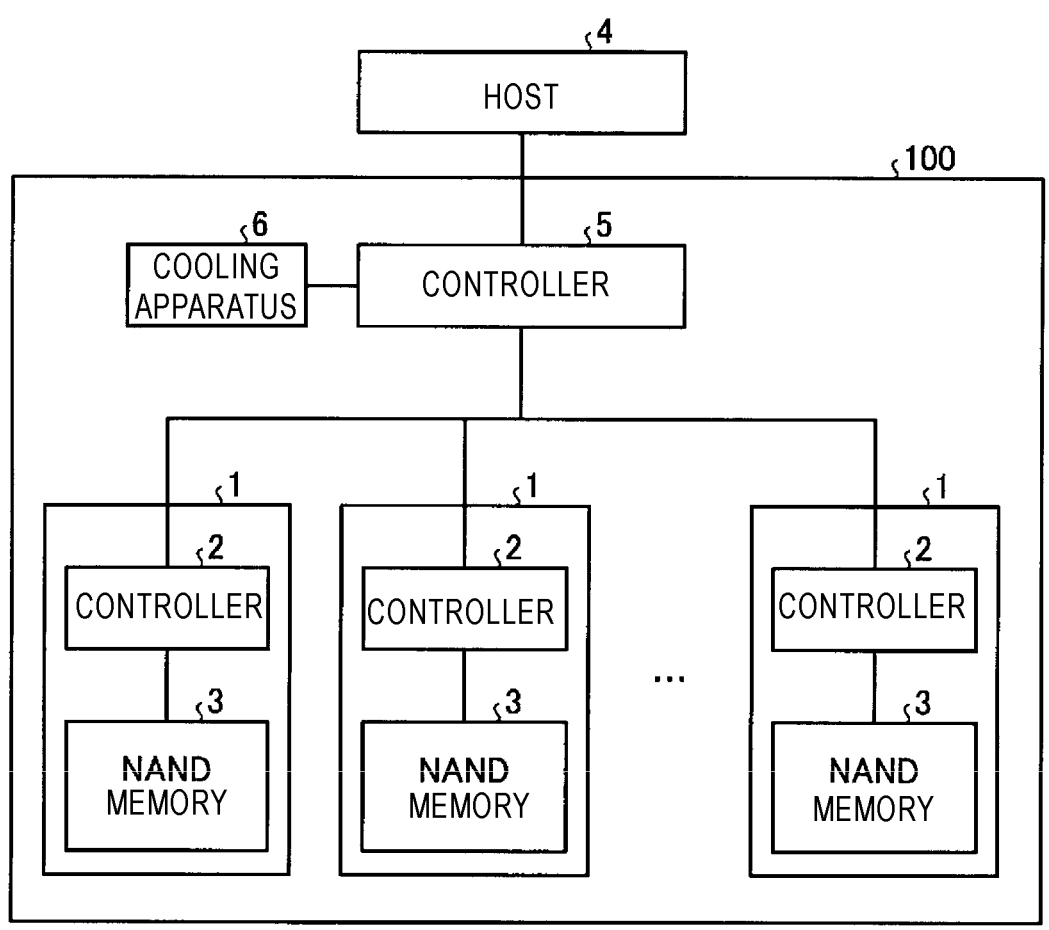
FIG. 13 is a block diagram illustrating a schematic configuration of a storage system according to a third embodiment.

With reference to FIG. 13, a storage system according to a third embodiment will be described. FIG. 13 is a block diagram illustrating a schematic configuration of the storage system 100 according to the third embodiment. As illustrated in FIG. 13, the storage system 100 includes a storage controller 5, a cooling apparatus 6, and plural memory systems 1.

The storage system 100 is configured as, for example, a cold storage that handles large amounts of data. The cold storage is a storage system having a purpose of storing data of which access frequency is low for a long period. The storage system 100 is connectable to the host 4 which may be a data center computer.

The storage system 100 includes the plural memory systems 1 of, for example, the first embodiment. However, the storage system 100 may include the memory system of any one of the second embodiment, and the first and second modifications.

The cooling apparatus 6 is configured to cool the memory system 1 in the storage system 100.

The storage controller 5 controls the entire storage system 100 and collectively controls the plural memory systems 1. When there is no access to the storage system 100 from the host 4, the storage controller 5 operates the cooling apparatus 6 to maintain the memory system 1 in the storage system 100 in a low temperature state. When there is an access to the storage system 100 from the host 4, the storage controller 5 issues a command, which depends on the nature of the access to the NAND memory 3, to a predetermined memory system 1 or transmits a command from the host 4 to a predetermined memory system 1. Further, the cooling apparatus 6 may be stopped to raise the temperature of a predetermined memory chip 31 in the memory system 1 which receives the command from the storage controller 5. That is, the warming command is issued to the memory controller 2 in the memory system 1.

The storage system of the comparative example does not have a cooling apparatus and does not have a NAND memory capable of performing the warming operation, and is managed and maintained, for example, at room temperature. In cold storage applications, standby time is long, and management and maintenance at room temperature are susceptible to data retention. The data retention is a phenomenon in which data of the memory cell is gradually lost.

However, installing the cooling apparatus simply in the storage system of the comparative example to maintain low temperature might result in problems. The reason is that in the low temperature state, a relatively long time is required for erasing or writing on a memory cell and the memory cell might become worn out. Further, in a case where the memory chip gradually generates heat due to a write operation, the temperature cross might occur when the memory chip is read in the low temperature state. Then, a read error due to the temperature cross might occur.

In the storage system 100 of the third embodiment, the NAND memory 3 in the storage system 100 is maintained at low temperature by the cooling apparatus 6 when the storage system 100 is on stand-by. As a result, it is possible to reduce an influence of data retention.

In the storage system 100 of the third embodiment, the NAND memory 3 is configured to perform the warming operation. As a result, even when the NAND memory 3 is maintained at the low temperature when the storage system 100 is on stand-by, the temperature of the NAND memory 3 can be raised to a predetermined temperature when there is access from the memory controller 2. Accordingly, the wearing out of the memory cell MC by writing at the low temperature or deterioration of the reading precision by the temperature cross can be prevented.

In the aforementioned embodiments, the nonvolatile memory is a NAND type flash memory 3, but is not limited thereto. Any of various nonvolatile memory devices may be used, including a resistance random access memory (ReRAM), and a ferroelectric random access memory (FeRAM). Further, the nonvolatile memory is not limited to a semiconductor memory, and the embodiment may be applied even to various memory media in addition to the semiconductor memory.

In the aforementioned embodiments, etc., the controller 23 of the memory controller 2 is a CPU that executes firmware, but the controller is not limited thereto, and some or all of functions of the controller 23 may be implemented by a hardware circuit, not the CPU that executes the firmware. For example, the memory controller 2 may have a field-programmable gate array (FPGA) or an application specific integrated circuit (ASIC), and some or all of the functions of the controller 23 may be executed by the FPGA or ASIC.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory system comprising:
a nonvolatile memory including a plurality of blocks, in each of which a plurality of memory cells is arranged between bit lines and a source line, the plurality of memory cells being arranged in rows and columns and the plurality of memory cells of a same row being connected to the same word line and the plurality of memory cells of a same column being connected to a same bit line; and
a memory controller configured to control an operation of the nonvolatile memory, wherein
the memory controller is configured to issue a warming command to the nonvolatile memory when a temperature of the nonvolatile memory is lower than a first temperature threshold, and
the nonvolatile memory, in response to the warming command, performs a warming operation that includes:
selecting a first block from the plurality of blocks, the first block being a defective block that is an invalid block or a free block that stores no valid data;
applying a precharging voltage to at least one bit line that is connected to memory cells of the selected first block, the applied precharging voltage being higher than a normal precharging voltage that is applied to a bit line of a normal block at a time of reading data stored in a memory cell connected to the bit line of the normal block,
causing current to flow through the at least one bit line of the selected first block, the current being derived from charges stored as a result of the precharging voltage being applied to the at least one bit line, and
applying a read pass voltage to each word line of the selected first block, the read pass voltage causing all memory cells connected to each word line to turn on.

2. The memory system according to claim 1, wherein the nonvolatile memory continues the warming operation until the temperature is equal to or higher than the first temperature threshold.

3. The memory system according to claim 1, wherein the nonvolatile memory continues the warming operation for a first period.

4. The memory system according to claim 3, wherein the memory controller acquires temperature information indicating the temperature of the nonvolatile memory after the nonvolatile memory finishes the warming operation for the first period and issues another warming command to the nonvolatile memory if the temperature of the nonvolatile memory is lower than the first temperature threshold.

5. The memory system according to claim 4, wherein the memory controller issues the warming command prior to issuing an access command to the nonvolatile memory when the temperature of the nonvolatile memory is lower than the first temperature threshold and issues the access command to the nonvolatile memory upon determining that the temperature is equal to or higher than the first temperature threshold.

6. The memory system according to claim 1, wherein the nonvolatile memory is configured to store multi-bit values in each memory cell.

7. The memory system according to claim 1, wherein the nonvolatile memory indicates a busy status while the nonvolatile memory is performing the warming operation.

8. A storage system comprising:
a plurality of memory systems, each having a nonvolatile memory including a plurality of blocks, in each of which a plurality of memory cells is arranged between bit lines and a source line, the plurality of memory cells of a same row being connected to a same word line and the plurality of memory cells of a same column being connected to a same bit line, and a memory controller configured to control operations of the nonvolatile memory; and
a storage controller configured to control the memory systems,
wherein the storage controller operates a cooling apparatus to cool the memory systems, and is configured to issue a warming command to one of the memory systems that is targeted in an access request from a host, and
wherein the targeted memory system, in response to the warming command, performs a warming operation that includes:
selecting a first block from the plurality of blocks, the first block being a defective block that is an invalid block or a free block that stores no valid data;
applying a precharging voltage to at least one bit line that is connected to memory cells of the selected first block, the applied precharging voltage being higher than a normal precharging voltage that is applied to a bit line of a normal block at a time of reading data stored in a memory cell connected to the bit line of the normal block, and applying a read pass voltage to each word line of the selected first block, the read pass voltage causing all memory cells connected to each word line to turn on.

9. The storage system according to claim 8, wherein the memory controller of the targeted memory system, upon receiving the warming command, passes on the warming command to the nonvolatile memory when a temperature of the nonvolatile memory is lower than a first temperature threshold.

10. The storage system according to claim 9, wherein the nonvolatile memory, in response to the warming command, causes an input/output circuit of the nonvolatile memory connected to the memory controller to repeatedly operate.

11. The storage system according to claim 9, wherein data is caused to be repeatedly exchanged between the nonvolatile memory and the memory controller.

12. The storage system according to claim 8, wherein the nonvolatile memory of the targeted memory system indicates a busy status while the nonvolatile memory is performing the warming operation.

\* \* \* \* \*